United States Patent [19]

Gheewala

[11] Patent Number: 5,495,486
[45] Date of Patent: Feb. 27, 1996

[54] METHOD AND APPARATUS FOR TESTING INTEGRATED CIRCUITS

[75] Inventor: Tushar Gheewala, Cupertino, Calif.

[73] Assignee: Crosscheck Technology, Inc., San Jose, Calif.

[21] Appl. No.: 929,873

[22] Filed: Aug. 11, 1992

[51] Int. Cl.$^6$ .................. H04B 17/00; G11C 29/00
[52] U.S. Cl. .................. 371/22.1; 371/21.1; 371/22.5
[58] Field of Search .................. 371/21.1, 22.1, 371/22.2, 22.3, 22.4, 22.5, 22.6, 25.1; 324/73.1, 158 R

[56] References Cited

U.S. PATENT DOCUMENTS

| | | | |
|---|---|---|---|
| 3,806,891 | 4/1974 | Eichelberger | 340/172.5 |
| 4,429,388 | 1/1984 | Fukushima et al. | 371/21.1 |
| 4,498,172 | 2/1985 | Bhavsar | 371/25 |
| 4,613,970 | 9/1986 | Masuda et al. | 371/25 |
| 4,739,250 | 4/1988 | Tanizawa | 324/73 R |
| 4,749,947 | 6/1988 | Gheewala | 371/22.6 X |
| 4,757,503 | 7/1988 | Hayes et al. | 371/21.1 |
| 4,860,290 | 8/1989 | Daniels et al. | 371/22.3 |
| 5,032,783 | 7/1991 | Hwang et al. | 371/22.3 X |
| 5,065,090 | 11/1991 | Ghewala | 371/25,1 X |
| 5,122,738 | 6/1992 | Simpson et al. | 371/21.1 X |
| 5,206,862 | 4/1993 | Chandra et al. | 371/22.1 X |
| 5,231,345 | 7/1993 | Katakura et al. | 371/22.6 X |
| 5,255,227 | 10/1993 | Haeffele | 371/21.1 X |
| 5,258,986 | 11/1993 | Zerbe | 371/21.1 X |
| 5,289,475 | 2/1994 | Slemmer | 371/21.1 |

FOREIGN PATENT DOCUMENTS

| | | |
|---|---|---|
| 0223714 | 11/1986 | European Pat. Off. |
| 61-62878 | 3/1986 | Japan. |
| 61-81078 | 4/1986 | Japan. |
| 61-181978 | 8/1986 | Japan. |

OTHER PUBLICATIONS

"Built–In Self–Test Techniques", pp. 21–28, *IEEE Design & Test*, Apr. 1985.
"Using Scan Technology For Debug and Diagnostics In A Workstation Environment", pp. 976–986, *International Test Conference*, 1988.
"ATPG Based On A Novel Grid–Addressable Latch Element", pp. 282–286, *ACM/IEEE Design Automation Conference*, 1991.
"Microelectronic Circuits", pp. 884 and 885, *Holt, Rinehart and Winston, Inc.*

Primary Examiner—Emanuel T. Voeltz
Assistant Examiner—Eric W. Stamber
Attorney, Agent, or Firm—Townsend and Townsend and Crew

[57] ABSTRACT

Individual elements of an integrated circuit such as storage elements, (for example, latch elements), can be selectively coupled to select lines and probe lines. During normal operation the latches are not connected to the select lines and behave as a normal latch. During a write/control test operation, the latch is connected to a select line and data placed on the select line is provided to an input of latch. Thereafter, the latch is placed into a latching state in response to the probe line and the clock signal, latching the data provided from the select line into latch. In order to read/observe data, the clock line and probe line are controlled to route data onto the associated select line. In one embodiment the probe line controls a transistor switch that connects the select line to the input of the latch. The probe line also controls a transmission gate which is placed in the latch to toggle the latch between a latching condition and a non-latching condition, in response to signals on the probe line. Preferably each select line and probe line are attached to a plurality of elements and each element is connected to one select line and one probe line. Thus, by placing signals on the select line and probe line, any individual IC element can be addressed for controlling and/or observing.

21 Claims, 4 Drawing Sheets

METHOD AND APPARATUS FOR TESTING INTEGRATED CIRCUITS

The present invention relates to on-chip apparatus for testing an integrated circuit chip along with a method for testing, and in particular, to a method and apparatus that permits data storage components to be individually controlled and observed without needing to form the storage elements into one or more shift registers for testing.

BACKGROUND OF THE INVENTION

Modern integrated circuits (IC'S) contain a large number of components or elements, most of which can be classified as either storage elements (i.e., a type of memory element such as a latch or flip-flop) or gates (i.e., non-memory elements such as combinational logic gates, invertors, and the like). In the process of designing and manufacturing integrated circuits, it is desired to test integrated circuits to determine whether the components of the integrated circuit are operating in the desired fashion. To accommodate testing, many IC'S include both main circuitry (i.e., the circuitry used at least for normal, non-test operation of the chip) and test circuitry (i.e., circuitry whose only function is to achieve desired testing of the IC). Such testing typically includes both controlling and observing the storage elements inside the IC. During a typical test, the storage elements are controlled to apply test patterns and the output is observed to verify the results of the test pattern application. It would theoretically be possible to provide a set of test leads or wires running to each storage element which is to be tested, with the test leads or wires being separate from the wires used during normal functioning of the element. Because a typical integrated circuit contains a large number of storage elements, this approach is generally considered infeasible because the large number of wires running between each individual storage element and test signal input and output sites (such as peripheral pads) would consume a large portion of the available surface area of the integrated circuit and make an integrated circuit of this type unrealistically expensive.

One approach to testing integrated circuits involves providing selectable connections between storage elements to configure the storage elements as one or more shift registers. For example, as depicted in FIG. 1, an integrated circuit 10 contains a number of storage elements 12a through 12g connected to logic circuitry 14a, 14b, 14c by normal-operation leads 16a through 16p. The logic elements are, in turn, connected to input-output pads 18a through 18o. During testing operation of the chip, however, the memory elements 12a through 12g can be reconfigured, in response to a test signal, so that at least some memory elements are connected in the form of one or more shift registers. As depicted in FIG. 1, for example, the memory elements 12a through 12g are connected in a shift register for providing data from one element to the next during each shift cycle, over shift lines 20a through 20g. FIG. 2 depicts circuitry that can be used for connecting the various storage elements such as flip-flop 12 which responds to a clock signal 22, such that when data 24 is input over input line 16, the flip-flop 12 stores the data. However, when serial test data SI 26 is input over test line 28 the serial data is stored in the flip-flop 12 and output on serial test data output line 20, to be available to the downstream-connected flip-flop in response to the clock signal 22. Examples of this approach are described, for example, in Dervisoglu Bulend "Using Scan Technology for Debug and Diagnostics in a Workstation Environment" *IEEE* 1988 *International Test Conference* paper 45.2, pages 976 through 986.

As seen from FIG. 1, the shift register approach eliminates the need for an individual set of test wires running from each individual storage element to peripheral pads of the chip and, instead, provides selectively useable serial interconnect lines 20a through 20g. The shift register approach, however, has certain disadvantages. As seen in FIG. 2, it adds 2 or more gates 30a, 30b, 30c to each flip-flop, increasing IC area and cost. The additional test circuitry slows downs the circuit speed. Furthermore, long shift registers 12a through 12g require a large number of test vectors to be provided in order to fully test a complex IC, thus increasing the time needed to conduct the test and the complexity involved in designing a test to achieve the desired confidence.

U.S. Pat. No. 4,613,970 issued Sep. 23, 1986 to Mesuda et al. discloses a method for diagnosing an integrated circuit having an input memory circuit and an output memory circuit connected to each combinational circuit. An input diagnostic signal is applied to at least one input memory circuit and a diagnostic signal is read out of the output memory circuit. An address signal selects the given one of the input memory circuits. As seen in FIGS. 3 and 4 of U.S. Pat. No. 4,613,970, this approach requires six additional control lines (Ai, Bi, Yj, Qj, C2, and Gr). U.S. Pat. No. 4,739,250 of Tanizawa discloses a test circuit with a plurality of basic gates arranged in a matrix with a plurality of row selection wires and a plurality of column selection wires. The structure requires three control lines, Sci, Sli and Mi. The device of Tanizawa is configured for testing basic gate cells, rather than memory elements.

SUMMARY OF THE INVENTION

The present invention provides a latch circuit that permits individually controlling and observing the memory element of an integrated circuit while requiring only two control lines in addition to those which are used during normal operations.

In one embodiment, the storage elements include data latches that are selectably coupleable to associated select lines and probe lines. A first controllable switch couples the input of the data latch to the associated select line in response to a signal on the associated probe line. A second controllable switch enables storage of data in the latch in response to the probe line signal. Data which is placed on one of the select lines can be directly (i.e., without intervening storage in another storage element of the main circuitry of the IC) stored in one of the latches. Data stored in one of the latches can be output to the associated select line for direct observation (i.e., without subsequent storage in another storage element of the main circuitry of the IC). The input and output of the data is accomplished using only the associated select line and associated probe line, along with the clock input (which is provided for use during normal operation of the circuit as well).

DESCRIPTION OF THE PREFERRED EMBODIMENT

Figure 3:
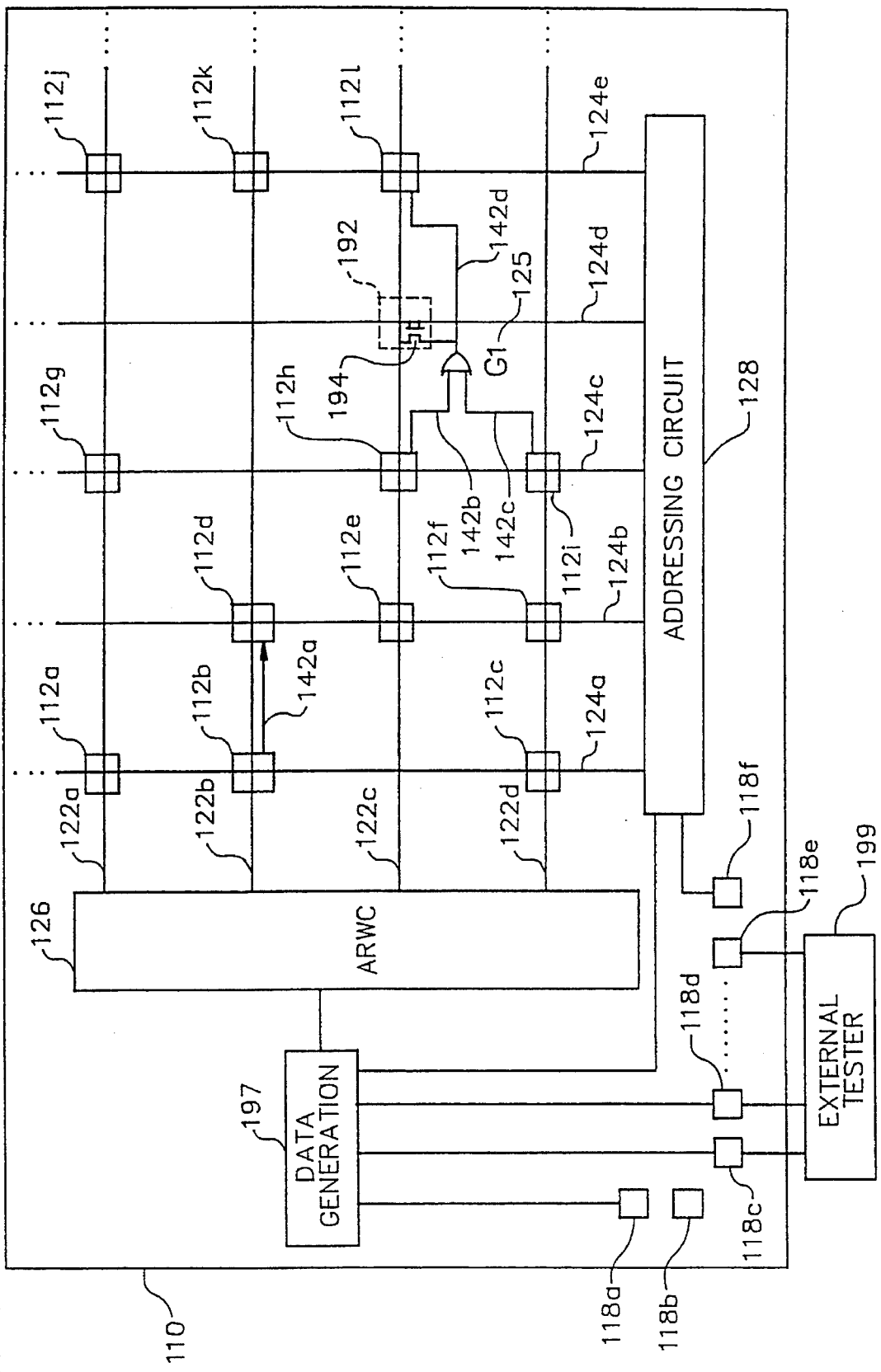
FIG. 3 is a schematic depiction of the connection of sense lines and probe lines to storage elements according to one embodiment of the present invention.

As shown in FIG. 3, an integrated circuit 110 includes a plurality of storage elements 112a through 112l. The integrated circuit 110 also includes a plurality of gate elements, only one of which 125 is depicted in FIG. 3. A number of conductors are provided which interconnect the storage elements with each other and with the gates, only four of which 142a, 142b, 142c, 142d are depicted in FIG. 3. The design, location and interconnection of the storage elements and gates are a function of the desired operation of the integration of the circuit and the details are not depicted in FIG. 3 as these are matters known to those skilled in the art. In addition to the interconnections 142a to 142d, used during normal operation of the integrated circuit 110, each of the plurality of storage elements 112a through 112o is also connected to one of a plurality of select lines, 122a through 122d and to one of a plurality of probe lines, 124a through 124e, in a manner to be described more fully below, for use during testing of the integrated circuit. The select lines 122a through 122d are connected to an addressing and read/write control component ARWC 126. The probe lines are connected to an addressing circuit 128. The ARWC 126 and Addressing Circuit 128 will be described more fully below. The ARWC 126 and Addressing Circuit 128 are controlled using control and data signals received either directly from peripheral input-output pads 118a through 118f or from intermediate circuitry on the integrated circuit 110 which may be addressing circuitry of a type known to those of skill in the art or as described below. The ARWC 126 and Addressing Circuit 128 also receive control and data signals from a data generator 197 which, for example, may provide pseudo-random test vectors either upon power up or in response to signals received from an external tester 199. The data on the sense line 122 can be provided from the peripheral pads, either directly or using intervening logic circuitry, or can be generated on the chip, for example, using data generator 197. The on-chip circuitry used to convey data from the peripheral pads and/or data generator and to provide the necessary clock signal are not depicted because circuitry to achieve the desired functions are known to those skilled in the art.

Figure 1:
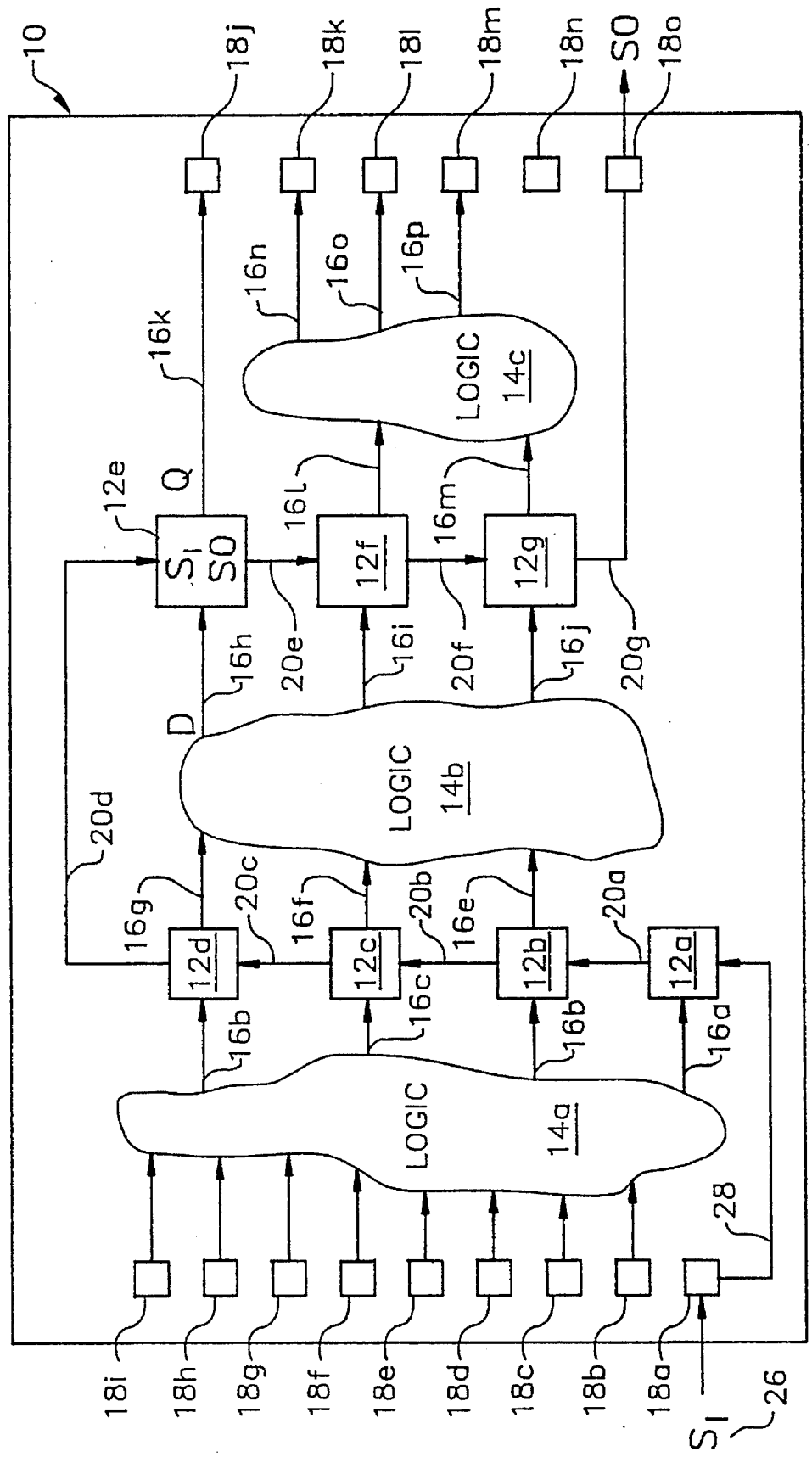
FIG. 1 is a schematic depiction of an integrated circuit in which storage elements can be connected in the form of a shift register, according to previous devices.
Figure 2:
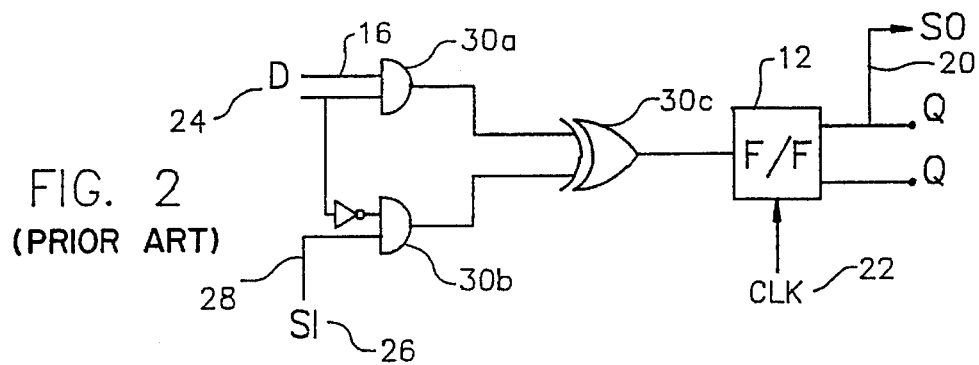
FIG. 2 depicts connections to a single storage element of FIG. 1.
Figure 4:
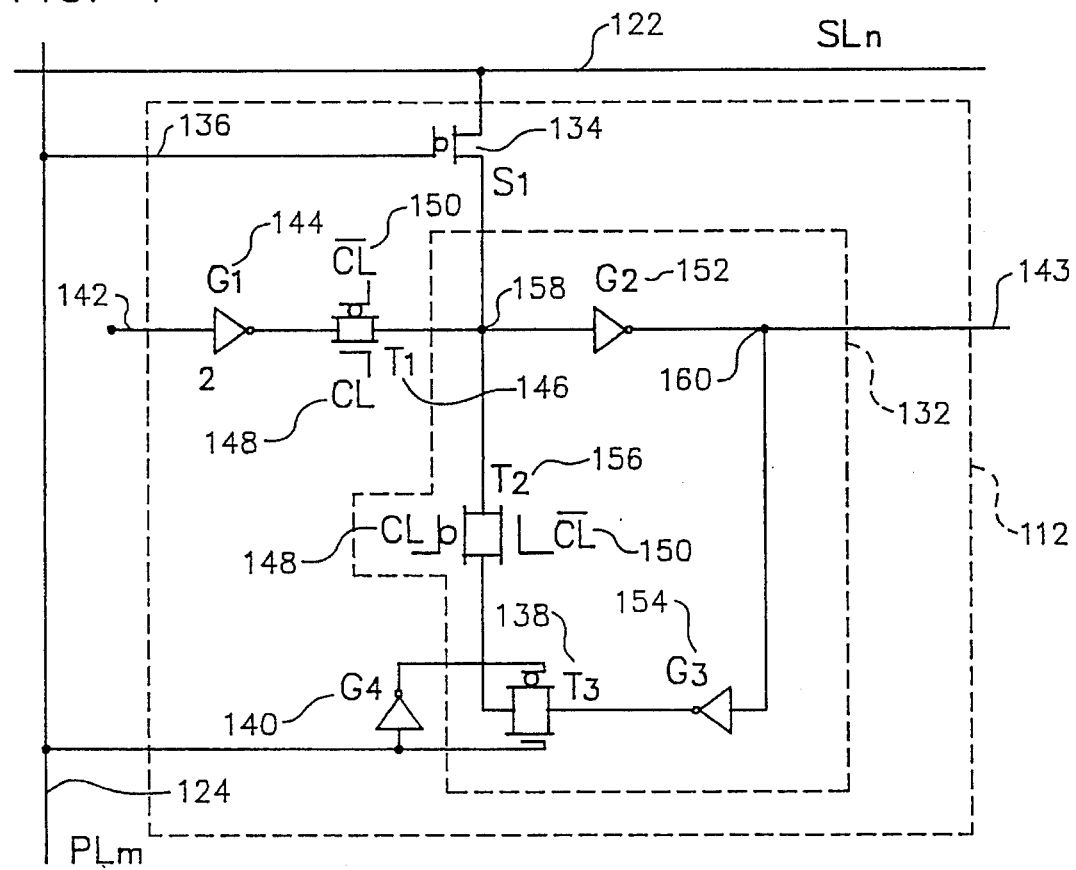
FIG. 4 depicts a single-storage element and associated circuitry according to one embodiment of the present invention.

As depicted in FIG. 4, one embodiment of the present invention includes a plurality of data latches 132 each of which can be selectively coupled to an associated one of the select lines, e.g. the nth select line $SL_n$ 122 and an associated one of the probe lines such as the mth probe line $PL_m$ 124. Coupling to the associated select line 122 is by way of a controllable switch $S_1$ 134 which is controlled via a connection 136 to the associated probe line 124. In the embodiment depicted in FIG. 4, the controllable switch 134 is a field effect transistor with the source and drain contacts connected to the latch 132 and select line 122 and with the gate terminal connected to the probe line 124. Any type of switch which permits the select line to be connected to the latch 132 under control of the probe line 124 can be used. Connection of the latch 132 to the probe line 124 is by way of a transmission gate T3 138 one control line of which is directly connected to the probe line 124 the other of the control line is connected to the probe line by way of an invertor G4 140. Although an FET as a sense device and transmission gate implementation are shown, the same functionality can be obtained by substituting the depicted structure with equivalent circuits such as tri-state drivers, bi-polar or BiCMOS logic and the like. Similar control from probe line 124 may be derived from various logic gates in place of invertor G4. The latch 132 is also connected to a data input 142 for use during normal (non-test) operation of the IC. In one embodiment the data input 142 can be the output 143 of a substantially identical upstream storage element 112. The input can also be from an upstream logic gate. Connection to the data input 142 is by way of an invertor G1 144 and a transmission gate T1 146. The transmission gate T1 146 is controlled in response to a clock signal CL 148 and its inverse $\overline{CL}$ 150. Input lines for the clock signal 148 and inverse clock 150 are not depicted in FIG. 4 since these are achieved in a manner well known to those skilled in the art.

The latch 132 includes first and second invertor gates G2, G3 152, 154, the transmission gate 138 and a second transmission gate 156. The second transmission gate 156 is controlled in response to the clock 148 and inverse clock 150 signals. As depicted in FIG. 4, when the transmission gates T3 138 and T2 156 are both in a conducting mode, the two gates 152, 154 will be in a cross-coupled configuration forming a latch having input and output nodes 158, 160.

The various gates and switches as shown in FIG. 4 will assume different configurations depending on the state of the select line 122, probe line 124 and clock 148. This is summarized in Table I.

TABLE I

| | INPUTS | | | RESULTS | | | |
|---|---|---|---|---|---|---|---|
| | Clk | $Pl_m$ | $Sl_n$ | S1 | T1 | T2 | T3 |
| Normal operation | | | | | | | |
| latched | 0 | 1 | DC | OFF | OFF | ON | ON |
| not latched | 1 | 1 | DC | OFF | ON | OFF | ON |
| Write\Control (during test) | | | | | | | |
| provide data | 0 | 0 | Data | ON | OFF | ON | OFF |
| store data | 0 | 1 | DC | OFF | OFF | ON | ON |
| Read\Observe (during test) | 1 | 0 | Z | ON | ON | OFF | OFF |

DC - Don't Care
Z - Not Actively Driven

Normal operation (non-testing operation) will be described first. During normal operation, the probe line $PL_n$ is maintained in a "1" or high state. This places switch S1 134 in an open or "off" state. Thus, there is no pathway from the select line $SL_n$ to the latch 132 during normal operation. Because the probe line 124 is high, the transmission gate T3 138 is in an "on" state. Accordingly, during normal operation, whether the latch 132 is in a latched or non-latched state depends only on whether the transmission gate T2 156 is on or off. The state of the transmission gate T2 is controlled solely by the clock signal 148. Thus, as seen in Table I, during normal operation, when the clock is in a high "1" state, the transmission gate T1 is on and the latch 132 is in a "non-latched" condition. In the opposite clock state ("zero"), the latch 132 stores whatever data was provided at the input node 158 during the previous non-latched state and the transmission gate T1 is configured in a "off" state such that no further input from the data input line 142 will be allowed to perturb the state of the latch 132. In this way, it can be seen that when $PL_n$ equals one, the circuit depicted in FIG. 4 behaves like a normal clock-responsive latch. In order to achieve full testing, it is desired to both control or write to latch 132 and to read or observe data which is stored in the latch. The write/control test procedure involves two steps. The first step is the step of providing data on the select line as input to a latch and the second step is storing the data into the latch. As depicted in Table I, in the first step, data is provided on the select line 122, the associated probe line 124 is provided in a low or "zero" state and the clock 148 is in a low or "zero" state. Because the probe line 124 is in a low or "zero" state, the switch S1 134 is in an "on" or conducting state. Thus, the data on the select line 122 is provided through switch S1 to the input node 158 of the gate 132. Because the clock signal is low, transmission gate T1 is "off" such that any data on data input line 142 will not perturb the state of the input node 158. The latch 132 is in a "not-latched" state since transmission gate T3 is "off".

In the second step, the data which was provided to the input node 158 (via switch S1 from line $SL_n$ 122) is latched in the gate 132. In order to store the data, the clock signal is maintained in the low or "zero" state. The signal on the probe line $PL_m$ 124 is changed to the "1" or high state. This causes transmission gate T3 138 to change to a conducting state thus latching the data in the latch 132. When this happens, the switch S1 changes to a non-conducting state and the test data on the select line $SL_n$ can now be changed without changing the data in the latch.

In order to read or observe data in an individual latch of the integrated circuit, the clock is held at a high or "1" state while the probe line 124 is held at a low or "zero" state. The select line is not actively driven during this procedure. As seen in Table I, the latch 132 is in an unlatched state because transmission gate T2 156 and T3 138 are both "off". Transmission gate T1 146 and switch S1 134 are both "on". Thus, test data from the data pin 142 is transferred to the select line 122 through gate G1 144, transmission gate T1 146 and switch S1 134. The data can then be read out through the select line. Thus, during the read/observe state, the data which is read out onto the select line is not the data from the latch 132 associated with probe line 124. Rather, it is the data which resides on the data pin 142. In one implementation, the data on the data pin 142 will be data from the "upstream" data latch. For example, referring to FIG. 3, if the write/control procedure described above is used for storing a byte of data into the latch 112b, the read/observe procedure can be used to place the data which is input into gate 112d (i.e., the data output from latch 112b) onto select line 122b.

Figure 5:
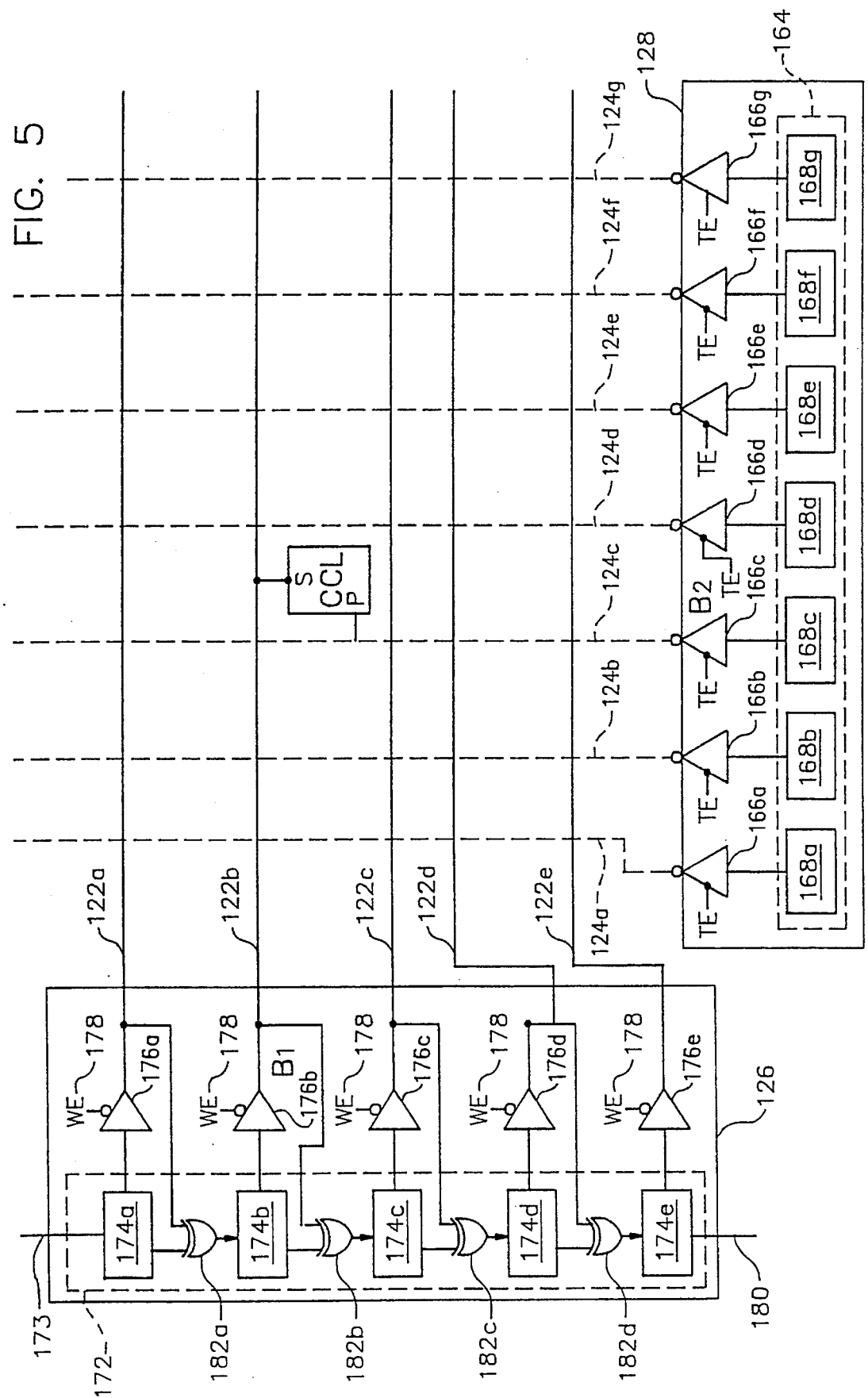
FIG. 5 depicts circuitry for addressing the probe lines and sense lines according to one embodiment of the present invention.

In order to address the individual storage elements to perform the write/control and read operations described above, it is necessary to provide signals on the select lines and probe lines in the desired sequence. A number of options are available for providing desired signals on the select lines and probe lines as depicted in FIG. 5. In one embodiment, the probe lines $PL_m$ are addressed by an addressing circuit 128 which includes a shift register/decoder 164 and enable buffers B2 166a–166g. If it is desired to address the probe lines 124a through 124g sequentially, a "1" can be shifted through the latches 168a through 168g of the shift register 164 while holding the "test enable" lines TE for the buffers 166a through 166g in an enabling state. If it is desired to address the probe lines in a different order, a decoder circuit could be used in place of a shift register as will be apparent to those skilled in the art. The select line addressing and read/write circuit (ARWL) 126 can include a data register 172 having a plurality of latches 174a through 174e. Data can be loaded into the data register 172 in a number of ways. In the embodiment depicted in FIG. 5, data can be shifted into the data register 172 through a serial input line 173. As will be apparent to those skilled in the art, data can also be provided to the register 172 in parallel. The data which is provided to the data register 173 can be provided through the peripheral pads 118 and/or from a data generator 197 as described above. The select lines 122a through 122e are driven by buffers 176a through 176e when the write enable signal WE 178 is "on", transferring test data in the select line data register 172 to the select lines 122a through 122e. This mode is used during the write/control portion of the test procedure. During read/observe, the write enable signals 178 are "off". In this way the test signal which is placed on the select lines 122a through 122e as described above, is transmitted to the input of the data register and captured there. The test data can then be shifted out through a serial output line 180 for example to an external tester. Alternatively, the data can be compressed into a signature. e.g. using exclusive OR gates 182a–182d. The signature generation capability of the data register 172 can also be used to generate pseudo-random test vectors on the integrated circuit, e.g. according to the procedures described in Chandra, et al., "ATPG Based on a Novel Grid-Addressable Latch Element" 28th ACM/IEEE Design Automation Conference, Paper 18.3, p 282–286, July 1991 and U.S. Pat. No. 5,206,862 issued Apr. 27, 1993 incorporated herein by reference. These on-chip generated test patterns can be written to the latches 112, resulting in a significantly reduced number of external test vectors needed to achieve the level of testing desired. A multiplexer instead of the exclusive OR gates 182a through 182d can be used if signature compression is not desired.

The addressing circuits 128, 126 can be connected to off-chip devices, such as to an external tester, through additional control circuits (not shown) or directly through input and output pins or pads 118.

The present invention can also be used in connection with reading/observing the output from a gate such as combinational logic and gate 125 depicted in FIG. 3. As shown in FIG. 3, in positions where the latch 112 is not located at the cross-point of a sense and probe line, an observational test point 192 can be added. In the embodiment depicted in FIG. 3, the observational test point 192 includes a switch 194 controlled by a probe line 124d to controllably provide the output of the gate 125 to a select line 122c.

In view of the above description, a number of advantages of the present invention are apparent. The present invention permits individually directly storing to and reading from storage elements of an IC while requiring only two additional wires connected to each storage element to achieve this function. Furthermore, each of these sense wires and probe wires can be connected to a plurality of storage elements. Thus, if there are N select lines and M probe lines, the present invention permits individually controlling and observing M×N storage elements using M×N additional wires. This reduction in the number of wires for achieving this function provides a significant reduction of the IC area which must be devoted to wires for testing purposes. The circuitry achieves the desired function while requiring only a small number of additional circuit elements at each latch. Compared with previous devices, the present invention has little impact on the speed of operation of the IC during normal operation because no gates are added in series with the data path. Compared with previous devices, the present invention provides for rapid operation during test procedures because test structures do not have to be serially shifted in and out of long shift registers. Since elements of the IC can be individually controlled and/or observed, the length and number of test vectors needed to achieve a desired degree of confidence is decreased compared to, for example, the requirements of shift register testing devices. Furthermore, the amount of time and effort needed to devise and generate test vectors to achieve the desired degree of testing is decreased, compared with the shift register approach, since individual elements can be controlled and observed. On-chip test pattern generation, including pseudo-random test vector generation, significantly reduces the number of external test patterns and the required test time.

A number of variations and modifications of the present invention can also be used. Other addressing apparatus and methods can be used such as decoders and ring counters. Testing can be implemented to both test the latches for proper latch operation and by using the latches as inputs for testing gate elements such as combinational logic elements. Test signals can be generated on-chip to achieve a built-in self-test (BIST) capacity e.g. in response to power-up of the IC. Some aspects of the invention can be used without using other aspects of the invention, For example, it is possible to use the disclosed control and observe aspect of the invention without using the signature generation aspect of the invention. The invention can be combined with other types of circuitry. For example, it is possible to use the disclosed invention for testing one portion of the circuitry while using the shift register approach for testing another portion of the circuitry. It is possible to use the present invention to control and observe a plurality of elements rather than a single storage element. Although the invention has been described by way of a preferred embodiment and certain variations and modifications, other variations and modifications could also be used, the invention being defined by the following claims.

What is claimed is:

1. In an integrated circuit, apparatus usable for testing any of a plurality of circuit components, comprising:
   a plurality of select lines and probe lines;
   a plurality of data latches, each having a data input, a clock input and an output, each of said plurality of data latches being selectably coupleable to an associated one of said select lines by
      a first controllable switch coupling the data input of each of said plurality of data latches to said associated one of said select lines in response to a first signal on an associated one of said probe lines;
      wherein a second controllable switch in each data latch enables latching of data in each of said plurality of data latches in response to said first signal on said associated one of said probe lines; and
   wherein, using only said associated select line, said associated probe line and said clock input, data placed on said associated select line is latched into the data latch associated therewith and data stored in the data latch associated with said associated select line is output to said associated select line.

2. Apparatus, as claimed in claim 1 wherein at least one of said plurality of data latches includes first and second inverters cross-coupled through a clock-controlled transmission gate.

3. Apparatus, as claimed in claim 1, further comprising a data input line, coupled to said data input by a clock-controlled transmission gate.

4. Apparatus, as claimed in claim 1, wherein said first controllable switch is a transistor having a first control terminal coupled to said probe line and second and third terminals coupled to said data input and said associated select line, respectively.

5. Apparatus, as claimed in claim 1, further comprising addressing means for selectively placing signals on said probe lines to connect a desired one of said plurality of data latches to a desired one of said select lines.

6. Apparatus, as claimed in claim 5, wherein said addressing means comprises a shift register.

7. Apparatus, as claimed in claim 5, wherein said addressing means comprises a decoder.

8. Apparatus, as claimed in claim 1, further comprising means, formed in said integrated circuit for generating data for placing on said select lines and for generating signals for placing on said probe lines to provide built-in self-testing of said integrated circuit.

9. Apparatus, as claimed in claim 8, wherein said means for generating data and signals includes means for generating test signals in response to power-up of said integrated circuit in order to provide built-in self testing of said integrated circuit.

10. Apparatus, as claimed in claim 1, further comprising means, formed in said integrated circuit, for generating pseudo-random data to provide test vectors for placing on said select lines.

11. Apparatus, as claimed in claim 1, further comprising a plurality of combinational logic gates, and means, coupled to one of said plurality of combinational logic gates, for providing an output of said one of said plurality of combinational logic gates to one of said select lines, in response to a signal on one of said probe lines.

12. Apparatus, as claimed in claim 1, wherein at least one of said plurality of data latches is a part of a flip-flop formed in said integrated circuit.

13. In an integrated circuit, apparatus usable for testing any of a plurality of components of the integrated circuit, the apparatus comprising:
   a plurality of select lines;
   a plurality of probe lines; and
   a plurality of data latches, each data latch having a data input and a clock input, each data latch further comprising:
      means for latching data into said data latch in response to a first signal on said clock input and a second signal on an associated probe line, the data being transmitted on an associated select line; and
      means for transmitting data from said data latch to said associated select line in response to a third signal on said clock input and a fourth signal on said associated probe line.

14. Apparatus, as claimed in claim 13, wherein each data latch further comprises means for storing data provided from said data input in response to a fifth signal on said clock input and a sixth signal on said associated probe line.

15. A method for writing to and reading from data latches in an integrated circuit, comprising:
   providing a plurality of select lines and probe lines;
   providing a plurality of data latches each having a data input, a clock input, an associated select line, and an associated probe line;
   coupling a first controllable switch between each data latch and said associated select line, said first controllable switch being responsive to a first signal on said associated probe line;
   coupling a second controllable switch in each data latch to said associated probe line, said second controllable switch also being responsive to said first signal on said associated probe line, said second controllable switch enabling latching of data in each data latch in response to said first signal;

placing desired data onto a first select line while holding said clock input in a first clock binary state and holding a first probe line in a first probe line binary state;

changing said first probe line to a second probe line binary state to latch the desired data into a first data latch;

placing said first select line in a non-actively-driven state;

placing said clock input in a second clock binary state; and placing said first probe line in said first probe line binary state to transmit data stored in said first data latch to said first select line.

16. A method, as claimed in claim 15, wherein data from a plurality of said plurality of data latches are placed on a first plurality of said select lines.

17. A method, as claimed in claim 16, further comprising combining data on said first plurality of select lines to provide a compressed data output signature.

18. A method, as claimed in claim 15, further comprising generating data for placement on said plurality of select lines.

19. A method, as claimed in claim 18, wherein said step of generating data is performed using circuitry on said integrated circuit.

20. A method, as claimed in claim 18, wherein said step of generating data comprises generating pseudo-random test vectors.

21. A method, as claimed in claim 15, further comprising providing a logic gate in said integrated circuit; and providing output from said logic gate onto at least one of said select lines in response to a signal on at least one of said probe lines.

* * * * *